United States Patent [19]

Shiki

[11] Patent Number: 5,043,774
[45] Date of Patent: Aug. 27, 1991

[54] LIGHT-EMITTING SEMICONDUCTOR DEVICE

[75] Inventor: Masatoshi Shiiki, Musashimurayama, Japan

[73] Assignee: Hitachi, Ltd., Tokyo, Japan

[21] Appl. No.: 503,731

[22] Filed: Apr. 3, 1990

[30] Foreign Application Priority Data

Apr. 5, 1989 [JP] Japan .................................. 1-084904

[51] Int. Cl.$^5$ .................... H01L 33/00; H01L 29/227
[52] U.S. Cl. ........................................ 357/17; 357/61; 357/63
[58] Field of Search .............................. 357/61, 63, 17

[56] References Cited

U.S. PATENT DOCUMENTS 3,374,176  3/1968  Potter ...................................... 357/17
3,541,375  11/1970  Aven ....................................... 357/17

FOREIGN PATENT DOCUMENTS 51-164275  7/1986  Japan .
61-172382  8/1986  Japan .
61-240592  10/1986  Japan .

Primary Examiner—Jerome Jackson, Jr.
Attorney, Agent, or Firm—Kenyon & Kenyon

[57] ABSTRACT

A light-emitting semiconductor device for emission of visible light of an $n^+np^+$ junction type, especially a light-emitting diode and thin film electroluminescence device, is constituted of semiconductor films including elements belonging to Groups II and VI of the periodic table. The device is formed by laminating an $n^+$ layer doped with n type impurity, an n layer which is a donor acceptor coactivated layer doped with n type and p type impurities and $p^+$ layer doped with p type impurity wherein the device has an $n^+np^+$ structure. The energy levels of the layers are such that the energy among n type impurity level $E_{D1}$ of the $n^+$ layer, n type impurity level $E_{D2}$ and p type impurity level $E_{A2}$ of the n layer, and p type impurity level $E_{A1}$ of the $p^+$ layer satisfies $E_{D1} \leq E_{D2}$ and $E_{A1} \leq E_{A2}$.

3 Claims, 3 Drawing Sheets

5,043,774

LIGHT-EMITTING SEMICONDUCTOR DEVICE

BACKGROUND OF THE INVENTION

1. Field of the Invention

The present invention relates to a light-emitting semiconductor device and especially to a light-emitting diode and an electroluminescence device and methods for making them.

2. Description of Related Art

According to the conventional light-emitting diodes made using ZnS, blue light emission has been obtained from a thin film type MIS structure comprising a semiconductor substrate and a ZnS layer containing an impurity, a high resistivity layer and an electrode layer which are successively laminated on a substrate. Japanese Patent Kokai (Laid-Open) Nos. 61-164275 and 61-172382 relate to light-emitting semiconductor devices of this kind. In these conventional light-emitting semiconductor devices, a low resistivity n-ZnS layer containing Al is used as an impurity-containing ZnS layer and a ZnS layer free from impurities is used as a high resistivity layer.

Furthermore, Japanese Patent Kokai (Laid-Open) No. 61-240592 has proposed use of a ZnS layer containing a halogen donor and an acceptor selected from the group consisting of Au, Ag and Cu as a light emitting layer for thin film electroluminescence.

The light-emitting diode of the above-mentioned conventional techniques, has the problems of low emission efficiency and low stability of emission spectrum. The blue light emission of this light-emitting diode is due to the recombination center of Al donor and acceptor produced by crystal defects. That is, a trivalent Al ion forms a donor level of $-150$ meV in ZnS crystal and the vacancy of Zn forms a deep acceptor level ($-700$ meV). There has been the problem that it is very difficult to control the concentration of the spontaneously produced acceptor in high reproducibility. Furthermore, there has been a problem in the stability of the emission spectrum because two emission bands are produced by a self activated (SA) center and a donor-acceptor (DA) center between Al donor and $V_{Zn}$ acceptor. An additional problem is that emission efficiency is determined by low hole injection efficiency from high resistivity layer.

Among the above-mentioned conventional techniques, thin film electroluminescence has the problem that the stability of the formed DA center and emission efficiency are inferior since the acceptor is doped by thermal diffusion.

SUMMARY OF THE INVENTION

An object of the present invention is to provide a blue light emitting diode of high emission efficiency and high performance and a method for manufacturing it.

Another object of the present invention is to provide a full color light-emitting diode and a full color thin film electroluminescence which have a high emission efficiency and high performance and methods for manufacturing it.

DETAILED DESCRIPTION

Technical means applied to the light-emitting semiconductor device of the present invention for attaining the above objects will be explained below.

Generally, control to n-type conduction or p-type conduction is possible by adding a given impurity to ZnS crystal. Conduction types arising from various impurities being added at certain ionization energies are shown in Table 1.

TABLE 1

| Kind of ion | Ionization energy (meV) | Conduction type |
| --- | --- | --- |
| Al | 100-150 | n |
| Cl | -200 | n |
| I | -14 | n |
| Li | -150 | p |
| Na | -190 | p |
| Cu | -1250 | — |
| Ag | -720 | — |
| N | -130 | p |

With reference to the formation of n-type ZnS, a semiconductor thin film crystal of 1 Ω·cm or less can be easily obtained by doping of the element belonging to Group III or VII of the periodic table by a molecular-beam epitaxy (MBE) method, an organometal chemical vapor deposition (MOCVD) method, and a gas source MBE (MOMBE) method, which are thermal non-equilibrium deposition methods. However, with reference to p-type ZnS, p-type conduction can be obtained by doping of Li or Na belonging to Group I or N belonging to Group V of the periodic table, but it is difficult to obtain a low resistivity of 1 Ω·cm or less. Even if a pn junction is formed using the above-mentioned ions that are under easy pn control, only ultraviolet emissions of 3 eV or more in photoenergy can be obtained. However, blue - red light emission can be obtained by forming a donor.acceptor pair in ZnS by combining either of Cu or Ag, which are not so suitable as a p-type impurity, with a suitable donor impurity. This coactivated ZnS has high resistivity due to the mutual compensation of charge by a donor and an acceptor, but the resistivity can be slightly lowered by producing the state of excess compensation of charge by either one of the ions.

Figure 1:
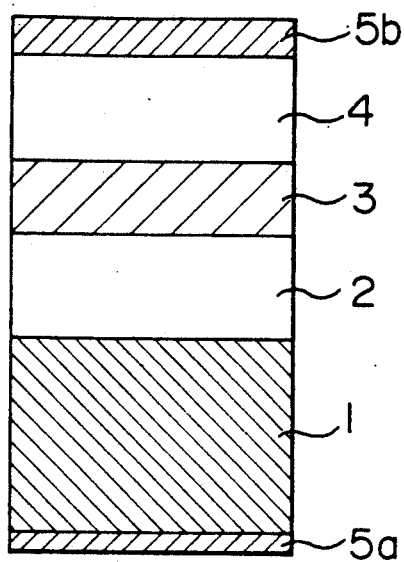
FIG. 1 is a sketch which shows one example of the construction of a light-emitting semiconductor device according to an embodiment of the present invention.
Figure 2:
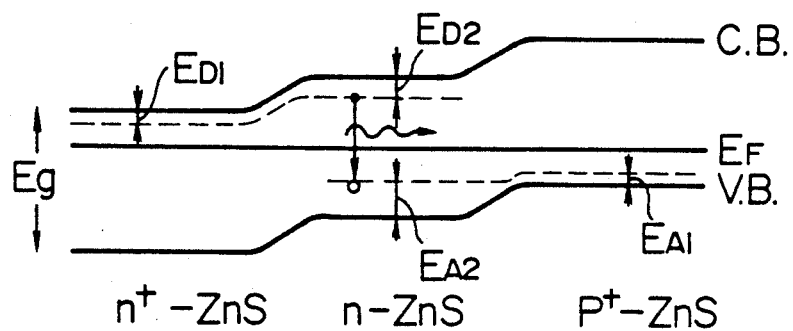
FIG. 2 shows an energy level in the light-emitting semiconductor device illustrated in FIG. 1.

Therefore, in the present invention, an active layer which shows the emission of donor.acceptor pair is applied to a light-emitting semiconductor device in order to obtain a light-emitting semiconductor device which provides visible light emission of high efficiency. One example of the construction of a light-emitting semiconductor device of the present invention is shown in FIG. 1. As shown there, the light-emitting semiconductor device of the present invention is obtained by forming, on a semiconductor substrate 1, a low resistivity n+-ZnS layer 2, then n-ZnS layer 3 doped with a donor.acceptor pair, and p+-ZnS layer 4, and finally forming bottom electrode 5a and top electrode 5b. It is one of the characteristics of the present invention that in this n+np+ structure, the donor.acceptor pair is formed in the n-ZnS layer 3. The level of the n+np+ structure in the light-emitting semiconductor device of the present invention is shown in FIG. 2, wherein the energy gap of ZnS is shown by Eg ($-3.6$ eV at room temperature), Fermi level is shown by $E_F$, the conduction band is shown by C.B., the valence band is shown by V.B., the donor level in n+-ZnS layer 2 is shown by $E_{D1}$, the acceptor level in p+-ZnS layer 4 is shown by $E_{A1}$, and the donor level and acceptor level in n-ZnS layer 3 are shown by $E_{D2}$ and $E_{A2}$, respectively. Here, the characteristics of the energy level according to the present invention are that $E_{D1} \leq E_{D2}$ and $E_{A1} \leq E_{A2}$ are satisfied. The light-emitting semiconductor device shown in FIG. 1 can be obtained by doping ionic species which satisfy the above relations of energy level in n+-ZnS layer 2, n-ZnS layer 3 and p+-ZnS layer 4. Furthermore, the (Zn, Cd)S mixed crystal can similarly be applied as a crystal material.

Further, in order to realize the construction of the light-emitting semiconductor device of the present invention, a chemical vapor deposition method (CVD method), especially a reduced pressure MOCVD method according to which a reaction pressure is 100 Torr or lower, or a gas source MBE method which are conducted under thermally non-equilibrium conditions, are employed for film formation.

The ionic species used for obtaining blue, green, red light-emitting diodes are Al, Cl, I, Ag, Cu, N and Li. Furthermore, in order to realize the thin film electroluminescence of full color, a $Zn_xCd_{1-x}S$ film containing donor.acceptor pair which is formed by a thermal non-equilibrium deposition method is employed as an emission layer of thin film electroluminescence.

Emission obtained from a p-n junction diode in which n- and p-type impurities which can lower the resistivity of ZnS are used is limited to only near an ultraviolet region. The donor.acceptor coactivated ZnS layer used in the present invention acts as a recombination area of electrons injected through an n-ZnS layer and holes injected through a p-ZnS layer, whereby the DA (donor.acceptor) pair in the coactivated ZnS becomes a recombination center to form a photon of an energy corresponding to a difference in energy between the DA pair.

In ZnS, Ag-Cl and Ag-Al, which are the DA pair, act as blue color center and Cu-Cl and Cu-Al act as green color center. Furthermore, Cu-Cl and Cu-Al in (Zn, Cd)S act as red color center and thus a light-emitting diode of the three primary colors can be obtained.

According to the MOCVD method and gas source MBE method employed for the formation of the ZnS film or (Zn, Cd)S film, a compound semiconductor film doped with impurities under thermally non-equilibrium conditions can be stably deposited and so the coactivated ZnS or (Zn, Cd)S film of a high quality and high emission efficiency can be formed.

In a thin film electroluminescence, since a light emission ZnS layer is formed on an oxide, the ZnS film becomes a polycrystalline film. Further, the DA pair center is generally formed with a distance of 50-100 Å between donor and acceptor. Therefore, it is considered that if a crystallite which has a minimum size in a polycrystal has a size of 50-100 Å, the possibility of crystal defect being present between the DA pair center increases and emission efficiency decreases. It is considered that the ZnS film formed by the reduced pressure MOCVD method has a large crystallite size and hence a donor.acceptor coactivated layer of high efficiency can be formed.

Coactivated $Zn_xCd_{1-x}S$ films formed by the CVD method under a suitable deposition pressure have a large crystallite size and a stable DA pair and thus can also be applied to thin film electroluminescence to which a high electric field is applied.

The present invention will be explained in more detail by the following examples and with reference to the drawing figure.

EXAMPLE 1

Figure 3:
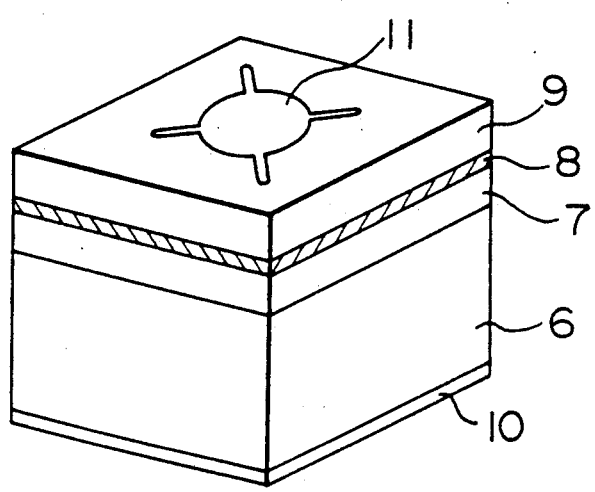
FIG. 3 is a sketch which shows one example of the construction of another embodiment of a light-emitting semiconductor device of the present invention made in Example 1 mentioned hereinafter.

Construction of the light-emitting semiconductor device made in this example is shown in FIG. 3.

Low resistivity n-GaAs substrate 6 was used as a semiconductor substrate. First, n+-ZnS:Al layer 7 of 4 μm thick was formed as n+-ZnS layer. Next, n-ZnS:Ag,Al layer 8 of 1 μm thick was formed as n-ZnS layer. Then, p+-ZnS:N layer 9 of 4 μm thick was formed as p+-ZnS layer. Finally, InGa alloy electrode 10 and Au electrode 11 were formed on the back side of the n-GaAs substrate 6 which is a semiconductor substrate and on the p+-ZnS:N layer 9, respectively and then the electrodes were subjected to heat treatment at 380° C. for 5 minutes to make ohmic electrodes.

Formation of n+np+ structure in this example was carried out by continuously depositing n+, n, and p+ layers using a reduced pressure MOCVD method (organometal chemical vapor deposition method) as an epitaxial deposition method. DEZn (diethylzinc) and H$_2$S (hydrogen sulfide, diluted to 2% with hydrogen) were used as source reactants for Zn and S. TEAl (triethylaluminum), $C_8H_{20}Ag_2P_2$ (bis-μ-dimethylmethylenephosphoranylmethyldisilver) and NH$_3$ (ammonia gas) were used as doping materials.

Deposition of each ZnS film was carried out at a substrate temperature of 350° C., and under a deposition pressure of 1 Torr after adjusting a back pressure to $1 \times 10^{-6}$ Torr or lower. The n-GaAs substrate 6 was subjected to surface washing with an etchant of H$_2$SO$_4$:H$_2$O$_2$:H$_2$O of 4:1:1 (mixing ratio) and then heat treatment at 550° C. for 10 minutes in a reaction furnace. Flow rates of source reactants at the formation of n+-ZnS:Al layer 7 were 30 cc/min for DEZn, 900 cc/min for H$_2$S/H$_2$ and 10 cc/min for TEAl/H$_2$. TEAl was introduced into a reaction furnace with H$_2$ as a carrier gas. The cylinder temperature for DEZn was 15° C. For the formation of n-ZnS:Ag,Al layer 8, a flow rate of doping material for Al donor was 10 cc/min and that of doping material for Ag acceptor was 15 cc/min. In this case, cylinder temperatures for doping materials for Al and Ag were kept at $-5$-0° C. and 60°-90° C., respectively. For the formation of $p^+$-ZnS:N layer 9, NH$_3$ was used as doping material for nitrogen and the flow rate thereof was 100 cc/min. In this case, the flow rates of DEZn and H$_2$S were 400 cc/min and 700 cc/min, respectively.

Figure 4:
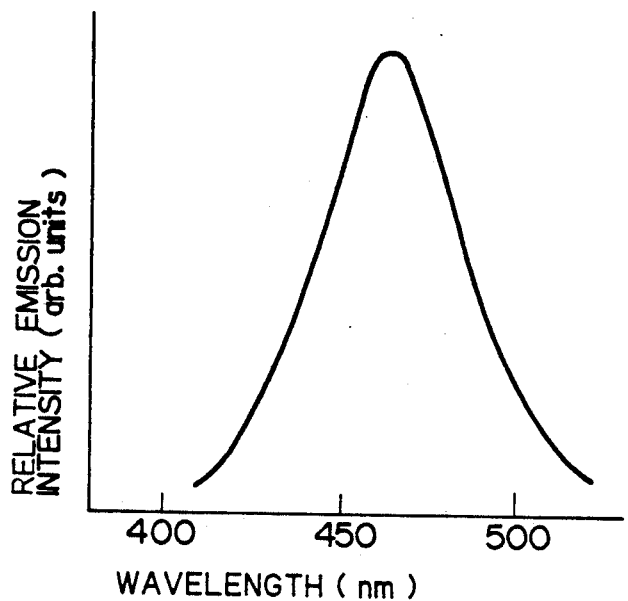
FIG. 4 is a graph which shows the emission spectrum of the light-emitting semiconductor device shown in FIG. 3.

Direct current was applied between Au electrode 11 and InGa alloy electrode 10 of the thus formed light-emitting semiconductor device to obtain blue light emission having the emission spectrum as shown in FIG. 4 under an applied voltage of 10 V or higher. The resulting emission spectrum was broad, having a peak around 460–470 nm. It is considered that this is due to the emission from the n-ZnS:Ag,Al layer 8 formed as recombination area of electrons and holes.

Al donor level was <100 meV, Ag acceptor level was <720 meV and N acceptor level was <130 meV. Energy relation among the n-type impurity level $E_{D1}$ of the $n^+$ layer and the n-type impurity level $E_{D2}$ and the p-type impurity level $E_{A2}$ of the n layer and the p-type impurity level $E_{A1}$ of the $p^+$ layer shows the relations: $E_{D1} = E_{D2}$ and $E_{A1} >> E_{A2}$. As a result, blue light emission of a good color purity, as shown in FIG. 4, was obtained.

In this example, DEZn was used as a source reactant for zinc, but when Zn(CH$_3$)$_2$ (dimethylzinc) was used, a sufficient flow rate was obtained even if the temperature of source reactant cylinder was about 0° C. and a blue light emitting diode having good characteristics was obtained as in this example.

It has been confirmed by the method of this example that Ag-Cl, Au-Al, Au-Cl, Cu-Al, Cu-Cl, etc. each can be used as the combination of impurities for forming a DA pair, and the DA pair can be formed using AuCH$_3$.(OCF$_3$)$_4$C$_2$H$_2$ as doping material for Au and Cu(C$_5$H$_5$).P(C$_2$H$_5$)$_3$ as doping material for Cu. Furthermore, iodine and bromine were able to be used as halogen in addition to chlorine.

EXAMPLE 2

Figure 5:
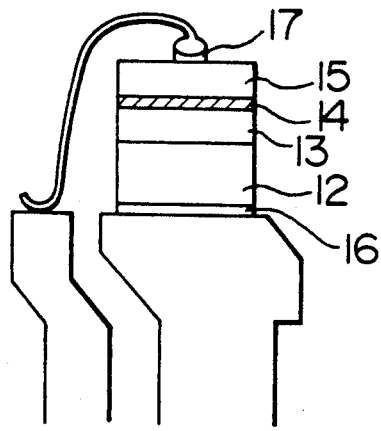
FIG. 5 is a sketch which shows one example of the construction of yet another embodiment of a light-emitting semiconductor device of the present invention made in Example 2 mentioned hereinafter.

One example of the construction of a light-emitting semiconductor device made in this example is shown in FIG. 5.

A low resistivity n-GaP substrate 12 was used as a semiconductor substrate and on this substrate were formed $n^+$-ZnS:Al layer 13 of 3 μm thick as an $n^+$-ZnS layer, n-ZnS:Cu,Al layer 14 of 1 μm thick as n-ZnS layer and then $p^+$-ZnS:N layer 15 of 3 μm thick as $p^+$-ZnS layer. Deposition of each layer was carried out by a reduced pressure MOCVD method at a deposition pressure of 0.1 Torr. Source reactants used were DEZn and H$_2$S and the doping material used was TEAl. Cu(C$_2$H$_5$).P(C$_2$H$_5$) (cyclopentadienylcopper triethylphosphorus) was used as doping material for Cu and NH$_3$ was used as doping material for N. Feeding of the Cu doping material was carried out at a doping material cylinder temperature of 60°–70° C. and by controlling the flow rate of H$_2$ carrier gas to 10–15 cc/min. Film forming conditions were the same as in Example 1 except for the deposition pressure of respective layers.

The emission obtained from the light-emitting semiconductor device made in this example was a broad band having a peak at 530 nm. The color of emitted light was green and of a good color purity. In FIG. 5, 16 and 17 indicate electrodes.

It is considered that electrons injected through $n^+$-ZnS:Al layer 13 which is an $n^+$ layer and holes injected through $p^+$-ZnS:N layer 15 which is a $p^+$ layer are confined in the high resistivity n-ZnS:Cu,Al layer 14 which is a recombination area and undergo radiation recombination between Al donor level and Cu acceptor level and as a result, a good green light emission having a photon energy of about 2.3 eV is obtained.

EXAMPLE 3

Figure 6:
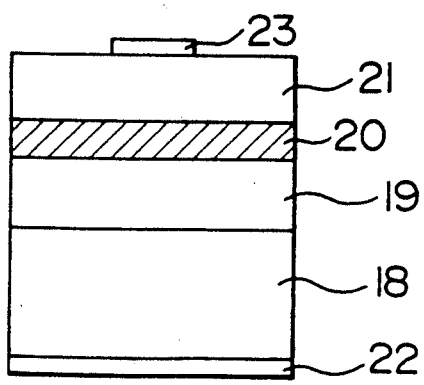
FIG. 6 is a sketch which shows one example of the construction of still another embodiment of a light-emitting semiconductor device of the present invention made in Example 3 mentioned hereinafter.

One example of the construction of a light-emitting semiconductor device made in this example is shown in FIG. 6.

A low resistivity n-CdS substrate 18 was used as a semiconductor substrate. As respective layers of $p^+nn^+$ structure, there were respectively formed $p^+$-Zn$_{0.8}$Cd$_{0.2}$S:N layer 21, n-Zn$_{0.8}$Cd$_{0.2}$S:Cu,Al layer 20 and graded $n^+$-Zn$_x$Cd$_{1-x}$S:Al layer 19 having a varied mixed crystal ratio of from 0 to 0.8. In FIG. 6, 22 and 23 indicate electrodes.

Deposition of Zn$_x$Cd$_{1-x}$S thin film was conducted by a reduced pressure MOCVD method using DEZn, H$_2$S and DMCd (dimethylcadmium) as source reactants. The mixed crystal ratio was controlled by controlling the ratio of flow rate of source reactants DEZn and DMCd. Deposition was carried out by changing the flow rate of DMCd from 40 to 10 cc/min while keeping the cylinder temperature of DMCd at 0° C. and also changing the flow rate of DEZn from 0 to 40 cc/min. Thickness of the graded layer was 5 μm.

Good red light emission, having a peak at 630 nm, was obtained from the light-emitting semiconductor device made in this example.

EXAMPLE 4

Figure 7:
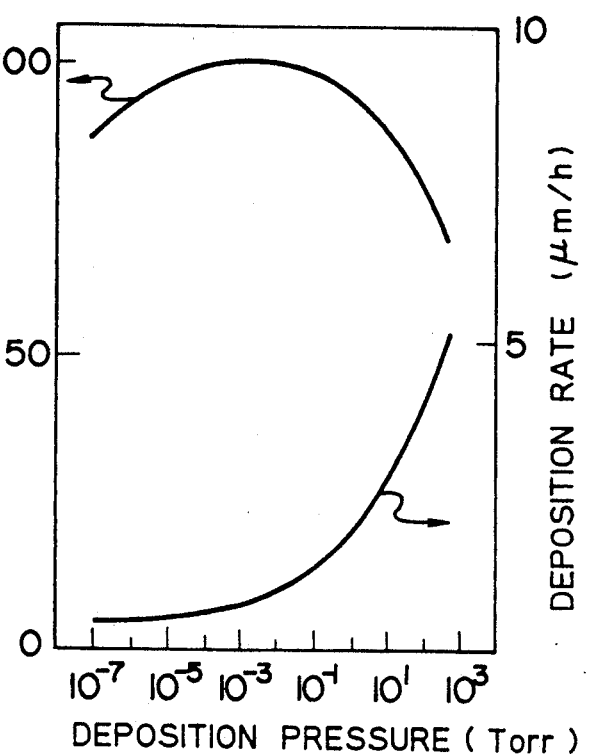
FIG. 7 is a graph which shows a relation among a pressure for deposition of the semiconductor film of the present invention, emission intensity and deposition rate.

In this example, relationships between the emission intensity of the light-emitting semiconductor device formed by the method of Example 1 and the deposition pressure and deposition temperature were obtained. FIG. 7 shows a relationship between the emission intensity (relative value) and deposition pressure (Torr) and deposition rate (μm/h). Deposition pressure was adjusted by changing the flow rate of H$_2$S/H$_2$ and DEZn under a constant source reactants ratio of Group VI element/Group II element of 1.5. Emission intensity was maximum in the area of deposition pressure of $10^{-5}$–$10^0$ Torr and an emission intensity of 80% of the maximum value was shown even under a pressure of $10^2$ Torr or lower. However, when the deposition pressure was extremely low, for example, to lower than $10^{-5}$ Torr, deposition rate decreased to 0.5 μm/h or less and this was not practical. Thus, the deposition pressure is preferably $10^{-4}$–$10^1$ Torr.

Figure 8:
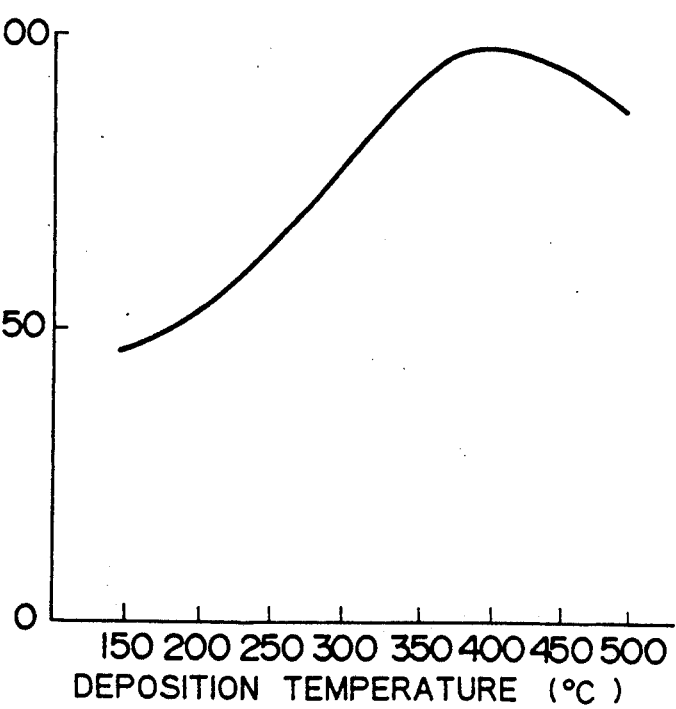
FIG. 8 is a graph which shows a relation between the deposition temperature of the semiconductor film of the present invention and emission intensity.

The relationship between the deposition temperature (°C.) and emission intensity (relative value) is shown in FIG. 8. Relatively strong emission intensity is obtained at a deposition temperature of 200° C. or higher, but a temperature of 300° C. or higher is more preferred. Therefore, the film formation by CVD method at a deposition pressure of 100 Torr or lower and a deposition temperature of 200° C. or higher is suitable for the production of the light-emitting semiconductor device of the present invention.

Furthermore, when a donor.acceptor coactivated Zn$_x$Cd$_{1-x}$S layer is formed on a glass substrate or a substrate having insulating film by the method of Example 1, desirably the deposition temperature is 600° C. or lower and the deposition pressure is $10^{-4}$ Torr or higher. Moreover, helium or nitrogen as well as hydrogen can be effectively used as a carrier gas.

As explained in detail hereabove, according to the light-emitting semiconductor device and a method for making the same of the present invention, any semiconductor devices having a band gap of more than the energy corresponding to visible region can be applied as light-emitting devices having visible light emission of high efficiency. Especially, since $Zn_xCd_{1-x}S$ type materials can be used, emission efficiency higher by more than one figure than conventional MIS type light-emitting diodes can be obtained.

Furthermore, $n^+np^+$ junction layer which constitutes the light-emitting semiconductor device of the present invention can be easily formed by CVD method. Excellent mass-production is possible. Thus, light-emitting semiconductor devices of high reliability with long life of 10,000 hours or more are obtained.

Moreover, the $n^+np^+$ junction layer of the semiconductor device of the present invention can be easily formed with high quality on a glass substrate or a substrate having an insulating film and thus the thin film electroluminescence device of high efficiency or thin film fluorescent material for a projection type cathode ray tube can be realized.

What is claimed is:

1. A light-emitting semiconductor device of an $n^+np^+$ junction type comprising semiconductor films comprising elements belonging to Groups II and VI of the periodic table and formed by laminating an $n^+$ layer doped with n type impurity, an n layer which is a donor acceptor coactivated layer doped with n type and p type impurities and $p^+$ layer doped with a p type impurity wherein the device has an $n^+np^+$ structure in which the correlation of the four energy levels an n type impurity level $E_{D1}$ of the $n^+$ layer, an n type impurity level $E_{D2}$ and a p type impurity level $E_{A2}$ of the n layer, and p type impurity level $E_{A1}$ of the $p^+$ layer satisfies $E_{D1} \leq E_{D2}$ and $E_{A1} < E_{A2}$.

2. A light-emitting semiconductor device according to claim 1, wherein the n layer which is a donor.acceptor coactivated layer comprises a semiconductor film shown by the formula:

$$Zn_xCd_{1-x}S$$

wherein x denotes an atomic ratio that is within the range of from 0 to 1.

3. A light-emitting semiconductor device according to claim 1 or 2, wherein the n layer comprises a $Zn_xCd_{1-x}S$ film doped with at least one acceptor impurity selected from the group consisting of Au, Ag and Cu and at least one donor impurity selected from the group consisting of Al, Cl and I.

* * * * *

UNITED STATES PATENT AND TRADEMARK OFFICE
CERTIFICATE OF CORRECTION

PATENT NO. : 5,043,774

DATED : August 27, 1991

INVENTOR(S) : Masatoshi SHIIKI

It is certified that error appears in the above-identified patent and that said Letters Patent is hereby corrected as shown below:

On the title page, under item [19], change "Shiki" to --Shiiki--.

Column 4, line 53, before "under" delete "and".

Column 8, line 10, change "$E_{A1} < E_{A2}$" to --$E_{A1} \leq E_{A2}$--.

Signed and Sealed this

Second Day of February, 1993

Attest:

STEPHEN G. KUNIN

Attesting Officer

Acting Commissioner of Patents and Trademarks